(12) United States Patent
De Lourenço E Vasconcelos et al.

(10) Patent No.: US 10,605,827 B2
(45) Date of Patent: Mar. 31, 2020

(54) METALLIC DEVICE FOR SCANNING PROBE MICROSCOPY AND METHOD FOR MANUFACTURING SAME

(71) Applicants: UNIVERSIDADE FEDERAL DE MINAS GERAIS—UFMG, Belo Horizonte (BR); INSTITUTO NACIONAL DE METROLOGIA, QUALIDADE E TECNOLOGIA—INMETRO, Rio de Janeiro (BR)

(72) Inventors: Thiago De Lourenço E Vasconcelos, Rio de Janeiro (BR); Bruno Santos De Oliveira, Rio de Janeiro (BR); Carlos Alberto Achete, Rio de Janeiro (BR); Braulio Soares Archanjo, Rio de Janeiro (BR); Ado Jorio De Vasconcelos, Belo Horizonte (BR); Luiz Gustavo De Oliveira Lopes Cançado, Belo Horizonte (BR); Wagner Nunes Rodrigues, Belo Horizonte (BR); Caroline Arantes Da Silva Wetzstein, Rio de Janeiro (BR); Rogerio Valaski, Rio de Janeiro (BR); Cassiano Rabelo E Silva, Belo Horizonte (BR)

(73) Assignees: UNIVERSIDADE FEDERAL DE MENAS GERAIS-UFMG (BR); INSTITUTO NACIONAL DE METROLOGIA QUALIDADE E TECNOLOGIA-IMMETRO (BR)

( * ) Notice: Subject to any disclaimer, the term of this patent is extended or adjusted under 35 U.S.C. 154(b) by 0 days.

(21) Appl. No.: 16/062,585

(22) PCT Filed: Dec. 13, 2016

(86) PCT No.: PCT/IB2016/057583
§ 371 (c)(1),
(2) Date: Jun. 14, 2018

(87) PCT Pub. No.: WO2017/103789
PCT Pub. Date: Jun. 22, 2017

(65) Prior Publication Data
US 2018/0372777 A1    Dec. 27, 2018

(30) Foreign Application Priority Data

Dec. 14, 2015 (BR) .......................... 1020150312032
Dec. 12, 2016 (BR) .......................... 1020160291267

(51) Int. Cl.
*G01Q 60/22* (2010.01)
*G01Q 70/10* (2010.01)
(Continued)

(52) U.S. Cl.
CPC ............. *G01Q 60/22* (2013.01); *G01Q 70/10* (2013.01); *G01Q 70/18* (2013.01); *G01R 1/067* (2013.01)

(58) Field of Classification Search
USPC ........................................................... 850/32
See application file for complete search history.

(56) References Cited

U.S. PATENT DOCUMENTS

| 5,282,924 A | * | 2/1994 | Bayer | ................... B82Y 35/00 216/11 |
| 5,442,300 A | * | 8/1995 | Nees | ....................... B82Y 35/00 324/755.07 |

(Continued)

FOREIGN PATENT DOCUMENTS

| WO | WO2010065071 | 6/2010 | ............... B82B 3/00 |
| WO | WO2014003843 | 1/2014 | ............. G01Q 60/38 |
| WO | WO 2014003901 | 1/2014 | ............. G01Q 60/22 |

OTHER PUBLICATIONS

Bharadwaj et al., "Spectral dependence of single molecule fluorescence enhancement," Optics Express, vol. 15, No. 21, Oct. 17, 2007 (9 pgs).

(Continued)

*Primary Examiner* — Phillip A Johnston
(74) *Attorney, Agent, or Firm* — Hayes Soloway P.C.

(57) ABSTRACT

Described is a device for use in scanning probe microscopy and to a method for manufacturing same. The metallic device has a single body with two parts, wherein the second part has a submicrometric point that defines a nanoscale apex. Also provided is a method for manufacturing a high optical efficiency probe for scanning probe microscopy.

17 Claims, 8 Drawing Sheets

(51) Int. Cl.
*G01R 1/067* (2006.01)
*G01Q 70/18* (2010.01)

(56) References Cited

U.S. PATENT DOCUMENTS

| | | | | |
|---|---|---|---|---|
| 6,000,280 | A * | 12/1999 | Miller | G01B 5/28 73/105 |
| 6,277,749 | B1 * | 8/2001 | Funabashi | H01L 21/02063 134/1.3 |
| 6,504,152 | B2 * | 1/2003 | Hantschel | G01Q 70/10 73/105 |
| 6,545,276 | B1 * | 4/2003 | Sasaki | G01Q 60/22 250/216 |
| 6,949,732 | B2 | 9/2005 | Kiguchi et al. | 250/216 |
| 6,999,657 | B2 * | 2/2006 | Walt | G11B 7/1384 365/215 |
| 7,074,340 | B2 | 7/2006 | Lugstein et al. | 216/11 |
| 2004/0085862 | A1 | 5/2004 | Matsumoto et al. | 369/13.33 |

OTHER PUBLICATIONS

Bharadwaj et al., "Optical Antennas," Advances in Optics and Photonics 1, 438-483 (2009) (46 pgs).
Bouhelier et al., "Near-Field Second-Harmonic Generation Induced by Local Field Enhancement," Physical Review Letters, vol. 90, No. 1, Jan. 10, 2003 (4 pgs).
Fleischer et al., "Gold Nanocone Near-Field Scanning Optical Microscopy Probes," ACS Nano, vol. 5, No. 4, 2011, 2570-2579 (10 pgs).
Hartschuh et al., "Near-field Raman spectroscopy using a sharp metal tip," Journal of Microscopy, vol. 210, Pt 3, Jun. 2003, pp. 234-240 (7 pgs).
Hartschuh, A., "Tip-Enhanced Near-Field Optical Microscopy," Handbook of Spectroscopy, Second Edition, 2014, pp. 1585-1610 (26 pgs).
Hayazawa et al., "Near-field Raman scattering enhanced by a metalized tip," Chemical Physics Letters 335 (2001) 369-374 (6 pgs).
Henzie et al., "Mesoscale Metallic Pyramids with Nanoscale Tips," Nano Letters, vol. 5, No. 7, 2005, 1199-1202 (4 pgs).
Huth et al., "Resonant Antenna Probes for Tip-Enhanced Infrared Near-Field Microscopy," Nano Lett. 2013, 13, 1065-1072 (8 pgs).
International Preliminary Report (w/translation) on Patentability issued in application No. PCT/IB2016/057583, dated Jun. 19, 2018 (14 pgs).
International Search Report and Written Opinion (w/translation) issued in application No. PCT/IB2016/057583, dated Jan. 27, 2017 (19 pgs).
Johnson et al., "Highly Reproducible Near-Field Optical Imaging with Sub-20-nm Resolution Based on Template-Stripped Gold Pyramids," ACS Nano, 2012, 6 (10), pp. 9168-9174 (7 pgs).
Lambelet et al., "Chemically etched fiber tips for near-field optical microscopy: a process for smoother tips," Applied Optics, vol. 37, No. 31, Nov. 1, 1998 (5 pgs).
Mauser et al., "Tip-enhanced near-field optical microscopy," Chem Soc Rev. Feb. 21, 2014; 43(4): 1248-1262 (32 pgs).
Nagpal et al., "Ultrasmooth Patterned Metals for Plasmonics and Metamaterials," Science 325, 594 (2009) (18 pgs).
Neumann et al., "A Resonant Scanning Dipole-Antenna Probe for Enhanced Nanoscale Imaging," Nano Lett. 2013, 13, 5070-5074 (5 pgs).
Novotny et al., "Antennas for light," Nature Photonics, vol. 5, Feb. 2011 (8 pgs).
Ren et al., "Preparation of gold tips suitable for tip-enhanced Raman spectroscopy and light emission by electrochemical etching," Rev. Sci. Instrum. 75, 837 (2004) (6 pgs).
Schmidt et al., "Adiabatic Nanofocusing on Ultrasmooth Single-Crystalline Gold Tapers Creates a 10-nm-Sized Light Source with Few-Cycle Time Resolution," ACS Nano, vol. 6, No. 7, 2012, 6040-6048 (9 pgs).
Taminiau et al., "$\lambda/4$ Resonance of an Optical Monopole Antenna Probed by Single Molecule Fluorescence," Nano Letters 2007, vol. 7, No. 1, 28-33 (6 pgs).
Vasconcelos et al., "Tuning Localized Surface Plasmon Resonance in Scanning Near-Field Optical Microscopy Probes," ACS Nano, vol. 9, No. 6, 2015, 6297-6304 (8 pgs).

* cited by examiner

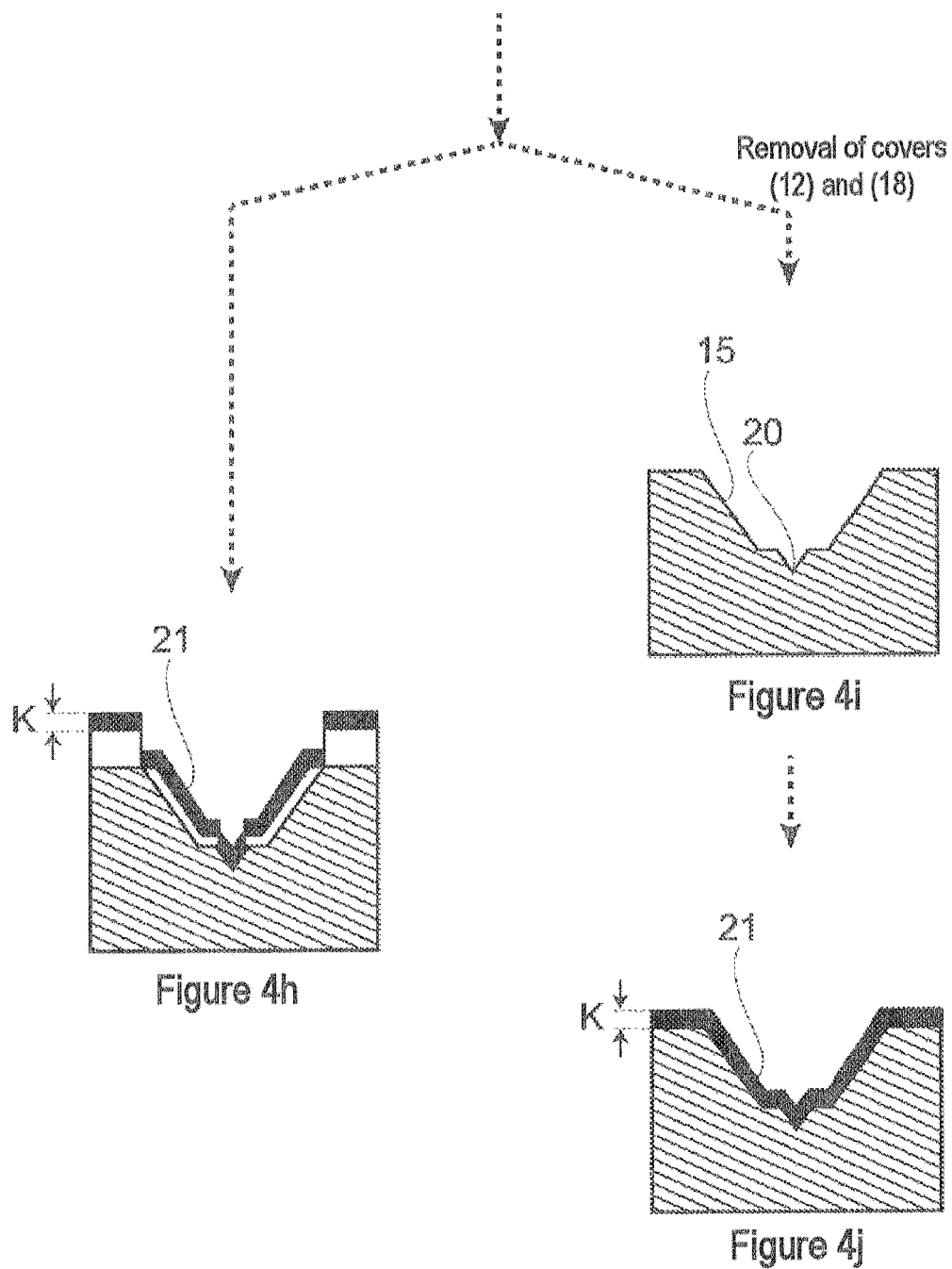

METALLIC DEVICE FOR SCANNING PROBE MICROSCOPY AND METHOD FOR MANUFACTURING SAME

FIELD OF THE INVENTION

The present invention refers to a device for scanning probe microscopy and a manufacturing method thereof. More precisely, there is described a device manufactured by lithographic techniques with reproducibility for use as a high-efficiency reproducible probe, such as a high-efficiency optical probe.

STATE OF THE ART

Conventional optical microscopes generate images with spatial resolution limited to approximately $\lambda/2$, i.e., approximately 300 nm in the case of use as a source of visible light ($\lambda$ being the wavelength of incident light). This limit is given by the Rayleigh criterion, which is defined as the separation between two point sources of light, such that the main maximum of diffraction of one of them coincides with the first minimum of diffraction of the other.

However, a higher spatial resolution than this limit can be reached within the near-field regime. One way to accomplish this type of experiment is through the use of a probe with a nanometric apex to collect part of the near-field regime information and transmit it to the far-field regime. Thus, the probe acts as an optical nanoantenna. In a simplified view, an optical nanometric source/collector pickup scans the sample generating an image with resolution defined by the size of the source/collector.

Recently developed, the scanning near-field optical microscopy (which acronym is SNOM, also called NSOM or NFOM) is a technique that uses this mechanism to generate images combined with the chemical and structural characterization on a nanometric scale. As a more specific example of this system, the TERS (acronym in English for *Tip Enhanced Raman Spectroscopy*, Chem. Phys. Lett. 335, 369-374 (2001)) using the Raman scattering in a near-field regime to create images of high spatial resolution.

Despite its application great potential, the SNOM technique is not applied routinely in laboratories because of the difficulty of manufacturing tips with high reproducibility, good optical efficiency, mechanical stability and nanometer apex, which are indispensable parameters for its application as probes in SNOM system.

Thus, different types of probes have been proposed over the last three decades.

Historically, the first probes were formed with fiber optic with a thinned end provided with the final opening of tens of nanometers. Other similar probes comprise transparent dielectric tips with a metallic cover. The system using this type of probe is called aperture-SNOM, highlighting the fact that these probes present an opening at its apex through which light is transmitted.

However, this structure has a major drawback: the power transmitted by the fiber optic decays exponentially with its diameter. For this reason, these opening by SNOM systems have spatial resolution on the order 50-1 nm and 00 are still limited to applications where the analyzed signal is very intense, such as photoluminescence.

The higher resolutions and optical efficiency achieved were obtained by using metallic probes without an opening, more specifically noble metals (Hartschuh et al., *Phys. Rev. Lett.* 90, 2003). The system that uses this type of probe is called scattering-type SNOM—s-SNOM or apertureless SNOM, hereinafter SNOM.

In these devices, the physical mechanism which leads to the use of the near-field information differs from the governing mechanism for the SNOM probe by the opening. Basically, the incident light (light source or the sample signal) makes collectively and consistently oscillate the free electrons of the metallic probe at the interface with the medium. Due to the lightning-rod effect, i.e., an increase on the electron density at the apex of the probes that occurs due to the conical, pyramidal or sharp shape for the most part of the same, an optical absorption is observed in the neighborhood of the apex thereof leading to an increase of the analyzed optical signal. Thus, unlike the fiber optic, the smaller the apex of the metallic probe, the higher the optical efficiency and the better the spatial resolution achieved. However, the increased signal generated only by the tips of effect is not sufficient for most applications in SNOM.

Moreover, electronic coherent oscillations may occur in a resonant way on exciting the surface plasmon. This is a solution of the wave equation and therefore the surface plasmon is a propagating wave on the metal surface. The result of their excitation to a metal edge is a strong optical effect located in the apex of the probe due to the high variation in electron density at that point. Intense signal increase factors can be observed by applying a probe having surface plasmon resonance on a SNOM system.

The current problem on the SNOM probe is the lack of reproducibility in the manufacturing of good tips, i.e., probes that generate sufficient electric field enhancement near its nanometric apex. The difficulty in producing good probes begins with the fact that only noble metal probes generate the desired plasmon effect for the technical functionality. Tips made of these metals with nanometric apex are difficult to be manufactured with reproducibility. But the problem worsens to be noted that even selecting morphologically appropriate gold tips, through inspection using scanning electron microscopy, only 20% showed themselves optically active, i.e., capable of being used as probes for SNOM (Hartschuh et al., *J. of Microscopy*, 210, 234-240 (2003)).

The publication by N. Mauser and co-authors (N. Mauser et al., *Chemical Society Reviews*, 43, 1248-1262 (2014)) comments that these weak increases of signal generated in most commonly used probes are not a result of excitation of surface plasmon at the tip, the increase linked only to the effect of tips (lightning rod effect).

Indeed, it is noted that most of the articles in the area of near-field optical microscopy is related to the production and characterization of the scan devices/probes (Lambelet, P., et al *Applied Optics*, 37 (31), 7289-7292 (1998); Ren, B., Picardi, G., Pettinger, B., *Rev. Sci. Instrum.* 75, 837 (2004); Bharadwaj, P., Deutsch, B., Novotny, L., *Adv. Opt. Photon.* 1, 438-483 (2009)). Some articles still dedicate to the application of surface plasmon excitation concept aiming at the improvement of the optical efficiency (L. Novotny et al., *Nature Photonics*, 5, 83-90 (2011); P. Bharadwaj et al., *Optics Express*, 15, 14266-14274 (2007); M. Fleischer et al., *ACS Nano*, 5, 2570-2579 (2011); T. H. Taminiau et al., *Nano Letters*, 7, 28-33 (2007); L. Neumann et al, *Nano Letters*, 13, 5070-5074 (2013); F. Huth, *NanoLetters*, 13, 1065-1072 (2013); S. Schmidt et al., *ACS Nano*, 6, 6040-6048 (2012)). However, none of the publications has some control mechanism of the energy of resonant optical absorption that is compatible to the industrial feasibility and reproducibility.

The state of the art for methods of manufacturing of probes metal structures shows some techniques, such as that described by WO2010/065071 on a method of manufacturing this type of structure, based on modeling methods to replicate metallic films from a substrate to produce plasmonic and meta-materials devices. This production process encompasses a reusable mold which provides a plurality of structures.

Considering also the aspect of reproducibility of morphology of SNOM probes, one of the same manufacturing technique has recently been reported by Johnson et al (ACS Nano, 2012). This technique, called gold stripped template pyramid, is based on the manufacturing, by optical lithography, of hollow micro-pyramids of gold (Johnson T. et al, *Highly reproducible near-field optical imaging with sub-20 nm resolution based on template-stripped gold pyramids, ACS Nano*, 2012, v6, issue 10, 9168-9174).

Said probes manufacturing technique has also been extensively discussed in other documents as J. Henzie, et al. (*Nano Letters*, 2005), or in P. Nagpal et al., (*Science*, 2009). In Johnson et al. (*ACS Nano*, 2012) there is reported that these pyramids have good spatial resolution and an acceptable signal increase when applied as probes in SNOM (J. Henzie et al., *Mesoscale metallic nanoscale pyramids with tips, Nano Letters* 2005, v5, Issue 7, 1199-1202; P. Nagpal et al *UltraSmooth patterned metal is plasmonics and meta-materials, Science*, 2009, V325, Issue 5940, 594-597).

In conformity with the above described techniques, the patent documents WO2014003843 and WO2014003901 also describe single structures manufacturing methods of nanometric metal tips from a support containing a plurality of molds in which the pyramidal structures that are single or linked to a lever are inverted created by general lithography techniques.

However, these methods are capable of producing only a single continuous pyramidal structure, and therefore has no structure or limit on its surface in the submicrometric range that provides a plasmon confinement in the visible and near infrared electromagnetic spectrum. Thus, the pyramids obtained by such methods do not exhibit surface plasmon resonance. The result is a low optical efficiency of the device.

The documents referred to above focus on the preparation of structures containing single pyramids which are not able to promote plasmon confinement and thereby ensure a high optical efficiency.

At this point, it is important to note that which worsens the quality of the probe for SNOM problem is that its optical efficiency is conditional upon the incident light coupling with the same surface plasmon. Basically, in the visible and near infrared, a considerable difference between the wave vector of the incident light and the surface plasmon inhibits its direct conversion.

One way to efficiently promote the coupling light/plasmon would be the use of so-called acronym in English LSPR (Localized Surface Plasmon Resonance). Such plasmon resonance occurs in nanostructures in dimensions lower than the wavelength of incident light, so in submicron structures for the visible and near infrared. Its main features are: (i) their resonance energy strongly depends on their geometry and can be scaled proportionally to any dimension of the object; (ii) the resonance can be directly and efficiently excited by light; (iii) resonance causes an increase of the electric field at their ends (optically active areas).

Recently, the present inventors have shown through the reference incorporated herein, T. L. Vasconcelos et al., (*ACS Nano*, 2015), that when LSPR is applied to SNOM probes, the optical efficiency can be improved by a factor greater than 5. In this referenced paper, the authors show that a next groove in the probe apex is fundamental to the surface plasmon confinement (LSPR), which generates a resonant optical absorption in the probe. It is also presented that the optical absorption resonance energy depends on the distance from cutting the apex, being equal to the energy of HeNe laser (widely used in the SNOM technique) when the groove in a gold tube is made about 240 nm in their apex. Thus, the paper points to the following conclusion: the optical absorption in the probe will be resonant (high optical efficiency) when there is a limiter (in this case, the groove) on its surface. The limiter, in turn, shall be positioned to submicron distances from the probe apex, being optimal at 240 nm from the apex of a gold probe when the HeNe laser is used in the SNOM system (T. L, Vasconcelos et al., *Tuning Localized Surface Plasmon Resonance in Scanning Near-Field Optical Microscopy Probes, ACS Nano*, 2015 v9, Issue 6, 6297-6304).

Consequently, it is desirable to develop devices with submicron structures that are capable of providing high optical efficiency by creating a localized surface plasmon resonance effect as well as methods for manufacturing these structures that add high reproducibility, uniformity and manufacturing in large scale, and to enable tuning the resonance energy (optimal optical efficiency) by changing the structural parameters.

To overcome the problems and state of the art deficiencies, the present invention describes a device for probe scanning primarily intended for microscopy and optical spectroscopy that is capable of generating an increase of electron density at its apex and plasmon confinement, thus providing a high efficiency optical device. These results are achieved by the structural construction of the device that will be better described below.

Continuing, the present invention provides a method of manufacturing the device of the present invention and high reproducibility quickly and efficiently can be produced on an industrial scale.

SUMMARY

Thus, the present invention provides improvements over conventional manufacturing techniques and modeling devices as well as devices for scanning probe microscopy such as devices used for microscopy and optical near-field spectroscopy.

Thus, a first object of the present invention is to provide a metallic device for scanning probe microscopy.

It is another object of the present invention to provide a metallic device for optical microscopy and near-field spectroscopy, as a probe, of high optical efficiency.

It is another object of the present invention to provide a method of manufacturing of metallic devices for scanning probe microscopy.

It is another object of the present invention to provide a method of manufacturing metallic devices for optical microscopy and spectroscopy.

It is another object of the present invention to provide a method of manufacturing metallic devices for microscopy and optical near-field spectroscopy as a probe.

Advantageously, the present invention provides a metallic device capable of generating a plasmon confinement giving the desired optical efficiency in scanning probe microscopy, specifically in microscopy and optical spectroscopy in near-field, providing thus a device of high quality that overcomes those in the state of the art.

Furthermore, the present invention is capable of providing a manufacturing method of the above-mentioned device, which provides reproducibility and also large-scale production of a device of high quality and optical efficiency for scanning probe microscopy, such as microscopy and optical spectroscopy.

Other objectives and advantages of the present invention will become more apparent from the following description and accompanying Figures, which are not intended to limit the scope of the present description.

In general, the present invention provides a metallic device for scanning probe microscopy, preferably microscopy and optical spectroscopy in the near-field, which comprises a single body arranged into two portions, wherein the second portion is a submicron tip that defines a nanometric tip as a pyramid, a cone and similar structures. The first portion of the single body of the device of the present invention consists of two bases parallel to each other, wherein a first base has a greater area than a second base; the second base is located on the second portion, which may optionally connect to the first portion by means of an extension.

This second portion has a submicron tip with size and configuration which favor the LSPR resonance and thus increase the optical signal produced by the device to be used as a microscopy and optical near-field spectroscopy probe.

In a second aspect, the present invention discloses a method of manufacturing metallic devices for scanning probe microscopy, such as microscopy and optical spectroscopy in the near-field, based on providing a first cover as a mask on a silicon substrate, which undergoes a first lithography process, under controlled reaction conditions, ending at the formation of a cavity with specific shape and dimensions; forming a second cover over the cavity formed in the previous step that exposes a second substrate that will undergo a second lithographic process.

The method of the present invention enables the design of size of the submicrometric pyramid located at the end or second portion of the device. Consequently, the method allows for fine adjustment of the optical absorption energy range of the device.

DESCRIPTION OF THE FIGURES

The attached Figures are included to provide a better understanding of matter and are incorporated herein by constitute part of this specification and illustrate embodiments of the invention and together with the description and the attached claims serve to explain the principles of the present invention.

FIGS. 4a-4k are schematic illustrations of embodiments of steps that comprise the manufacturing method of the present invention and show the dimensions B, B', G, H, H', K, M, N, N', P, and also a substrate (11), the first cover (12), the opening (13), bottom (14), side walls (15), second cover (16) opening (17), mask or second cover with an opening (18), the cavity (19) with pyramidal second bottom (20), metallic film (21), resin (22) for adhering the device to the end of the sensing system of the probe-surface interaction or a tungsten wire (23).

DETAILED DESCRIPTION OF THE INVENTION

Figure 1:
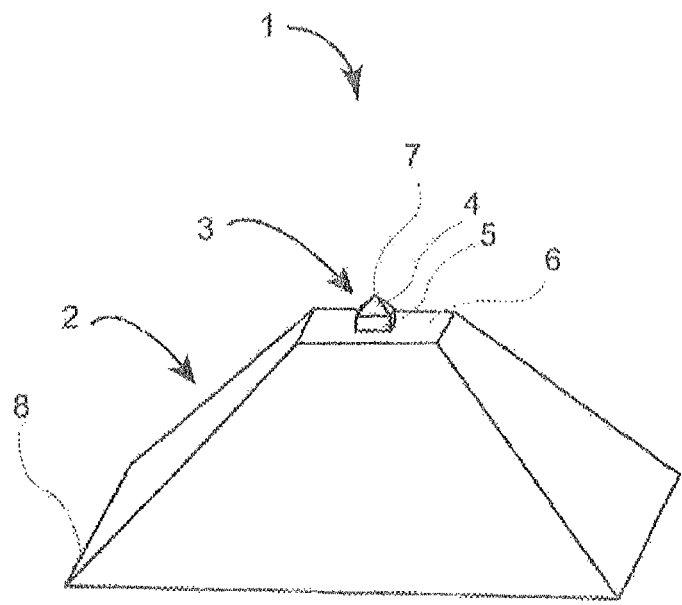
FIG. 1 is a schematic illustration of an embodiment of the device of the present invention having the single body (1) of the device, the first portion (2), second portion (3), submicron tip (4) extension (5), second base (6), nanometric apex (7), first base (8).

Additional features and advantages of the invention will appear in the detailed description which follows, and in part will be readily apparent to those skilled in the art from this description or recognized by the practice of the embodiments as described herein, including the detailed description, the abstract, as well as the attached drawings.

It should be understood that both the foregoing general description and the following detailed description and the embodiments of the invention are intended to provide an overview or framework for understanding the nature and character of the invention as claimed. The attached figures are included to provide a further understanding of the invention and constitute a part of this specification. The figures illustrate various embodiments of the present disclosure and together therewith serve to explain the principles and operation of the disclosure. Features shown in the figures are illustrative of the selected embodiments of the present invention and are not necessarily represented at the correct scale.

Throughout this specification, the word "comprise", or variations such as "comprises" or "comprising", should be understood to imply the inclusion of a stated element, integer or step, or group of elements, integers or steps but not the exclusion of any other element, integer or step, or group of elements, integers or steps.

To achieve the preliminarily stated objectives, there is provided according to the present invention a metallic device for applications in microscopy scanning probe and the same manufacturing method that add advantageously, both the effect of increased electronic density formed in the formed apex as well as those arising from the surface plasmon excitation of the formed apex, thus resulting in a device of high quality of optical efficiency.

Reference will now be made in detail to illustrative embodiments, the selected disclosure. Whenever it is possible, the same reference numerals will be used throughout the drawings to refer to the same or similar parts.

The present invention relates to a device for scanning probe microscopy by applications and a manufacturing method thereof.

The device comprises a single body (1) disposed in a first portion (2) and a second portion (3), wherein the second portion is a submicron tip (4) with a nanometric apex (7).

The first portion (2) of the single body (1) of the device of the present invention is formed by two bases (8) and (6), parallel to each other, wherein a first base (8) has a larger area than a second base (6); the second portion (3) is located on the second base (6), such that the second base (6) acts like a plateau to the second portion (3).

The bases (8) and (6) can be of different shapes, and may be circular, elliptical or polygonal with at least 3 sides.

The second base (6) is arranged at a distance L from the first base (8), wherein L ranges from 0.5 μm 250 μm, and preferably 10 μm.

The dimension H of the first base (8) ranges from 3 μm 300 μm, and preferably 22 μm.

The dimension C of the second base (6) ranges from 0.5 to 10 μm, and preferably 2 μm.

The second portion (3) comprises a submicron tip (4) with a nanometric apex (7) of nanometric size. A submicron tip (4) can have a circular, elliptical or polygonal base with at least 3 sides, regardless of the form of the bases (8) and (6). The dimension B of the base of submicron tip (4) can measure 50 nm to 1000 nm and preferably 450 nm.

This second portion (3) can be positioned in any part of the second base (6) of the first portion of the device (1).

At this point it is worth noting that the base (6) forms a plateau to the second portion (3), which makes it possible to have a fold or corner (9) which is responsible for the creation of a plasmon confinement edge to the submicrometric tip (4) of the second portion (3).

The plasmon confinement that is due to this structural construction generates LSPR resonance and increase the optical signal.

Thus, the structural conformation of the inventive device combines the synergy of the increase of the electronic density effects at the apex of submicron tip (4) with the plasmon confinement that is generated by forming the corner or fold (9) between the plateau (6) and the second portion (3), providing this device with high optical efficiency.

Figure 3A:
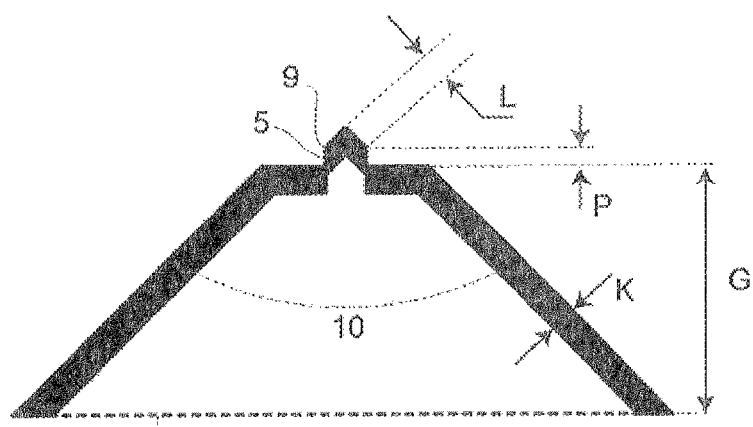
FIG. 3a is a schematic illustration of the side cross section of an embodiment of the device of the present invention that indicates the dimensions K, L and P, and the first base (8), the fold or corner (9) and the opening angle (10).

Additionally, the second portion (3) may further comprise an extension (5), as presented in FIG. 3a.

The extension (5) makes the connection between the submicron tip (4) and the second base (6) or plateau.

The extent (5) has a dimension P ranging from 10 nm to 500 nm and preferably 100 nm.

The provision of the extension (5) may provide facilities for manipulating the device, since this construction (5) allows greater freedom of action of the tip. Since the first portion (2) of the device (1) is larger than the second portion (3), the absence of the extension (5) will restrict the angle between the probe and the sample to approximately 90° (probe/sample approaching perpendicular). The extension (5) therefore allows greater freedom of action of the probe/sample, the probe can even be approximated to the sample in a different inclination other than 90°.

The device surface must be metallic, continuous and made of gold (Au), silver (Ag), platinum (Pt), copper (Cu), aluminum (Al), or combinations thereof. Alternatively, the extension (5) of the second portion may be non-metallic, thereby exposing the inner material used for removal of the device from the cavity, preferably epoxy glue.

The size of submicron tip (4) of the second portion (3) is a fundamentally important element for the present invention. The size L of submicron tip (4) of the second portion (3) has dimensions which can vary from 50 nm to 900 nm and preferably 450 nm when the gold device is intended for an optical system utilizing HeNe laser.

Advantageously, the size L of submicron tip (4) of the second portion (3) defines the maximum energy of resonant optical absorption, and it can be adjusted for different applications, within the range of visible and near infrared. This determines the importance of proposing a device described herein, having a structure with sharp end of submicrometric size (4) and positioned at the second base (6), which functions as a base or plateau to the second portion (3), for use in microscopy and optical near-field spectroscopy.

The surface size L of the submicron tip (4) of the second portion (3) can be adjusted according to the wavelength ($\lambda$) of the radiation (laser or light) used in the technique in which the probe will be applied. For this adjustment, and considering the probe made of Au, one may use the equation (1a):

$$L \text{ (nm)} = -65 \text{ nm} + 0.815 * \lambda \text{ (nm)} \tag{1a}$$

where L is the surface length of submicron tip (4) of the second segment (3) given in nanometers. However, it should be taken into account the uncertainty of 20% in the value of L.

The opening angle (10) faces the first portion (2) and the second portion (3) can vary between 30° and 100°, and preferably 70.52°. The preferred angle of 70.52° is defined by the angle between the families of crystal planes {111} and {-1-11} of silicon, as a substrate used in device manufacturing, and as will be highlighted below.

Figure 3B:
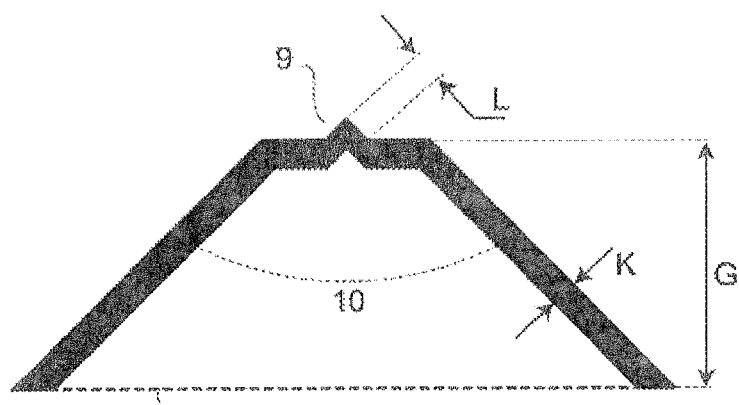
FIG. 3b is a schematic illustration of the side cross section of further embodiment of the inventive device that points to the dimensions K and L, and also the first base (8), the fold or corner (9) and opening angle (10).

The device may be hollow and comprises a metallic surface of the same material (Au, Ag, Cu, Pt, Al, or combinations thereof and alloys), and a thick metallic film K ranging from 50 nm to 1,000 nm, preferably 200 nm. It is important to highlight that the fold or corner (9) in the connection between submicron tip (4) of the second portion (3) and the extension (5), as illustrated in FIG. 3a, or even between the submicron tip (4) of the second portion (3) and the second base (6) of the first portion (2), as illustrated in FIG. 3b, acts as a key feature of this device by allowing the creation of a plasmon confinement to the submicron tip (4) of the second portion (3). Thus, the dimension L of the submicron tip (4) of the second portion (3) can be scaled with the wavelength of (laser or light light) incident radiation used on the system, leading to the resonant optical absorption in the device. This effect, in turn, leads to a better optical efficiency of the device for use in microscopy and optical near-field spectroscopy (TERS or SNOM).

The interior of the device may contain the epoxy adhesive used in its removal from the cavity or mold that will be better explained below.

Finally, the device may be attached to the sensing system of the probe-surface interaction, preferably a tuning fork or cantilever by means of epoxy glue. This way of using a molded metallic structure in a silicon pyramidal cavity has previously been reported in the papers: Henzie J., et al (Nano Letters, 2005), and P. Nagpal et al (Science, 2009).

In one embodiment, FIG. 1 shows a device according to the present invention, with a first base (8), a second base (6) having four sides as well as the square base of submicron tip (4) and also the extension (5).

Figure 2:
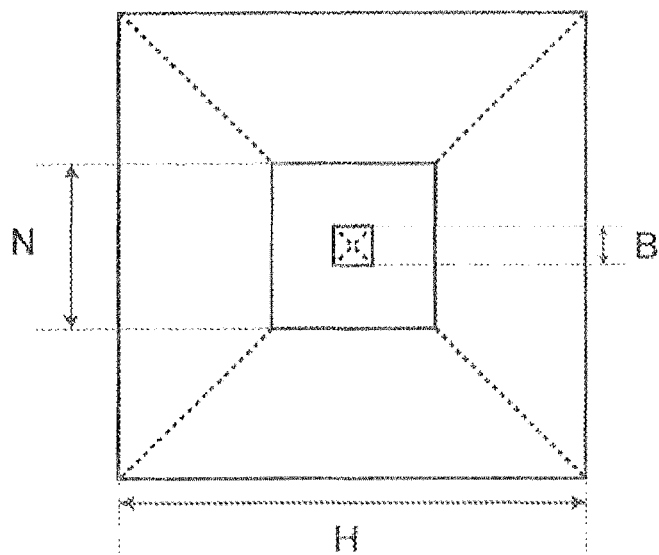
FIG. 2 is a schematic illustration of the top view of an embodiment of device of the present invention indicating the dimensions B, H and N.

This embodiment is further demonstrated in FIG. 2, a top view of a device according to the present invention. In this figure there can be seen the highlighted dimensions N and M of the bases (6) and (8) respectively, as well as the dimension B of the base of submicron tip (4).

FIG. 3a shows a cross section of an embodiment of the present invention, wherein the device has an extension (5).

Figure 3C:
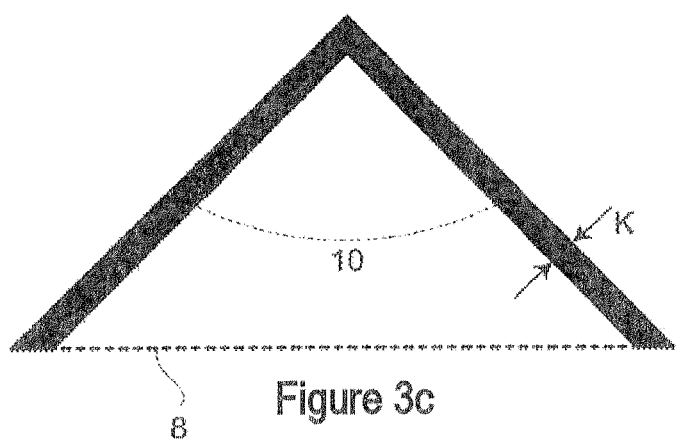
FIG. 3c is a schematic illustration of the side cross section of another embodiment of a device of the state of the art that indicates the size K and also the first base (8) and the opening angle (10).

Furthermore, FIG. 3b shows a cross section of another embodiment of the present invention without the extension (5). In comparison, FIG. 3c shows a cross section of the devices of the state of the art. At this point, it is possible to check the differences of the matter of the present invention with respect to that belonging to the state of the art. These constructive differences are responsible for ensuring the achievement of the advantages of the present invention, such as the creation of the fold or corner (9), which is responsible for the creation of a plasmon confinement in submicron tip (4) that generates the LSPR resonance and increase of optical signal.

In a second embodiment, the present invention addresses a method of manufacturing a device such as the device (1) described above.

With reference to the set of FIGS. 4a-4k, said method manufacturing of the device for scanning probe microscopy comprises the following steps:
 (i) forming a first cover (12) with at least one opening (13) on a substrate (11);
 (ii) anisotropic roughing of the substrate (11) to a depth G with a bottom (14);
 (iii) forming a second cover (16) on the bottom (14) and side walls (15);
 (iv) forming a second opening (17) in the second cover (16);
 (v) anisotropic roughing of the substrate (11);
 (vi) deposition of metallic film (21);
 (vii) withdrawing the metal device.

FIGS. 4a-4k illustrate the steps of performing the method with at least one opening in the cover (12). However, it is understood as the manufacturing of multiple openings in the same cover (12). These multiple openings (13) should be spaced a distance M equal for all, M being 10 µm to 1000 µm, preferably 100 µm, which will facilitate the alignment of the second process of anisotropic roughing, as will be seen further from FIG. 4f.

Figure 4A:
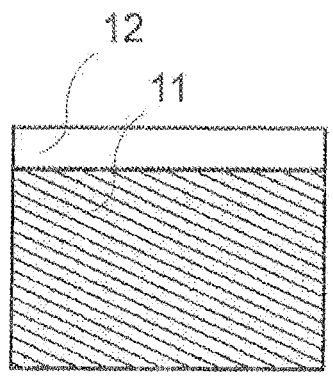

FIG. 4a illustrates the beginning of the method, which is part of a substrate (11) Si <100> with a first cover (12).

The first cover (12) may be comprised of silicon and oxygen, nitrogen, silicon or metal. Preferably, the cover (12) is a $Si_3N_4$ layer of 100 nm thick or $SiO_2$ of 300 nm thick. This cover (12) covering the Si substrate surface (11) will serve as a mask for the first anisotropic chemical roughing process. The substrate with a cover as described is commercially sold.

Figure 4B:
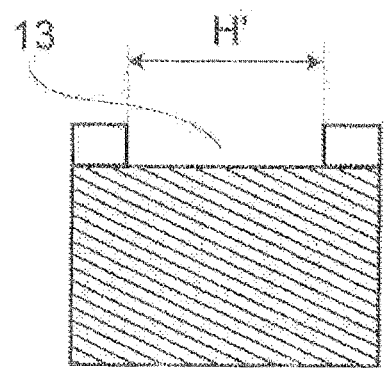

FIG. 4b illustrates the formation of a first cover (12) with at least one opening (13) as a mask, on a substrate (11). This opening (13) exposes the substrate (11) in this uncovered area.

The opening (13) of the first cover (12) may have a circular, elliptical or polygonal with at least 3 sides. The dimension H' of the opening (13) should have a total length of 3 µm to 300 µm, preferably 22 µm. Preferably, the opening (13) has a circular shape. The dimension H' of the opening (13) of the first cover (12) is equivalent to the dimension H of the first base (8) of the first portion (2) of the device. Since H' is a dimension used in the manufacturing of the cavity which functions to mold the device (1), H' has a value close to H, but may not be identical.

To generate the opening (13) and expose the family of planes {100} of the substrate (11) only in this region, one may use the process of focused ion beam lithography roughing directly the cover (12) in these regions. The optical lithography or electron-beam lithography (e-beam lithography) techniques may also be used to create the opening (13) on the cover (12), and to do so adding the steps of: (i) deposition of organic layer, (optical) photoresists or PMMA (e-beam) by spin coating; (ii) sensitization of the area to be roughed by optical or electron beam; (iii) developing, wherein the sensitized polymer film is removed by a specific solvent (isopropyl alcohol, for example); (iv) removing the $Si_3N_4$ or $SiO_2$ layer in regions not protected by the polymer, which will generate exposed Si areas, by dipping the sample for 2 to 20 minutes, better 5 minutes, into a BHF solution of 5:1 (Buffered Hydrofluoric Acid consisting of $NH_4F$ (40%) and HF (49%) solution in a 5:1 ratio).

Figure 4C:
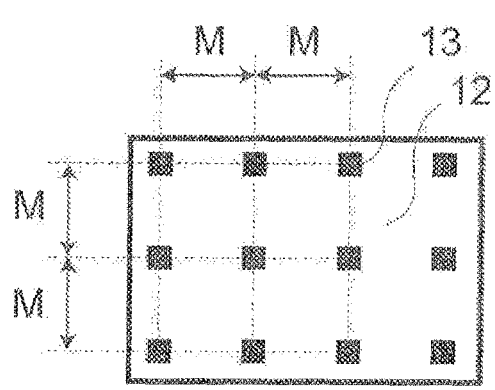

In an embodiment, FIG. 4c illustrates a top view of the cover (12), where there can be observed a plurality of openings (13) produced equidistant from each other with the dimension M of 10 µm to 1000 µm, preferably 100 µm.

Figure 4D:
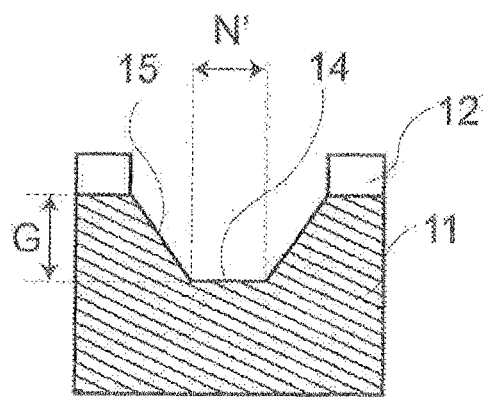

FIG. 4d illustrates the step of anisotropic roughing substrate (11) to a depth G, wherein a bottom (14) is created in the form of a plateau, with the dimension N'. The conditions of this reaction step are critical to obtaining a high efficiency device. These are conditions that ensure that the anisotropic roughing is terminated at a depth G of the substrate (11) creating a bottom (14), such as a plateau with size N' of 0.5 to 10 µm, preferably 2 µm. For the plateau size is approximately 2 µm, a fine adjustment of the given anisotropic roughing conditions of the substrate may be done simply by measuring the bottom (14) of the cavity by means of an optical microscope, the objective being the dimension N'. The dimension N' of the bottom (14) is equivalent to the dimension N of the second base (6) of the first portion (2) of the device. Since N' is a size of the mold cavity that functions for the device, N' has a value close to the value of N, but may not be identical.

Thus, a corrosive aqueous solution, preferably potassium hydroxide (KOH) or sodium hydroxide (NaOH) is used in a concentration from 15 to 40%, preferably 30% (by weight). The substrate (11) with the cover (12) and opening (13) is dipped in the solution at a temperature of 50 to 80° C. preferably at 65° C. for 10 to 200 minutes, preferably 40 minutes. Since the roughing of the silicon substrate (11) in a corrosive solution is anisotropic, the family of planes {100} of silicon is roughed approximately 300 times faster than the family of planes {111}. Moreover, the cover (12) covering the substrate (11) in the plane {100} will serve as a first mask, as it is not corroded by the solution. Thus, the planes {111} in the opening (13) are exposes to a depth G. If the process continued longer, it was expected to obtain a pyramidal cavity. However, the present invention wants the process to be stopped before reaching that point.

It is essential that this process of anisotropic roughing be ended when obtaining this bottom (14), as characterized above, since it is possible to obtain the desired plateau to be formed for the device of the present invention, responsible for creating a fold or corner (9) which confers plasmon confinement to the submicron tip (4) of the second portion (3), which enables the generation of LSPR resonance and the consequent increase in the optical signal.

The aim of this step is to create a bottom cavity (14) with a dimension N' which ranges from 0.5 µm to 10 µm, preferably 2 µm, as illustrated in FIG. 4D, where the planes (15) of the family of planes {111} are disclosed. However, there is still the plane of the family {100} of the bottom (14). The dimension N' of the bottom (14) depends on the optimum reaction conditions of this reaction step that enable this control, as well as the dimension H'.

Figure 4E:
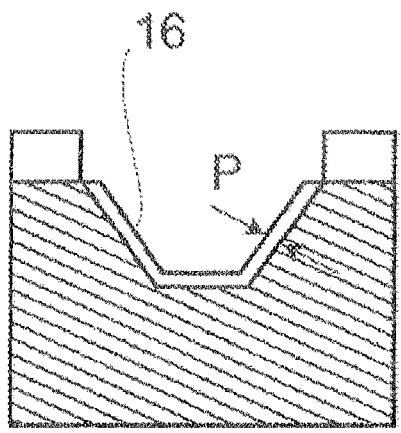

FIG. 4e illustrates the formation of a second cover (16) on the bottom (14) and side walls (15), which can occur by growth of $SiO_2$ of the silicon of the cavity created in the substrate (11). This new cover (16) of $SiO_2$ serves as a second mask for the second process of anisotropic roughing. Moreover, this step occurs in all cavities formed in the substrate (11).

The formation of the second cover (16), substrate (11) and the cavity created with the bottom (14) is preferably obtained by a heat treatment at a temperature of 800 to 1100° C., preferably 1000° C. for 30-600 minutes, preferably 300 minutes. The thickness P of the second cover (16) of $SiO_2$ generated by this method is 10 nm to 500 nm, preferably 100 nm depending on the humidity, gas composition and pressure within the oven.

Working in oven under ambient conditions, the thickness P is 100 nm. Note that the thickness P of the second cover (16) determines the dimension P of the extension (5) of the second portion (3) of the device (1). Alternatively, the second cover (16) can be formed or enlarged from the deposition of $SiO_2$ or $Si_3N_4$ by techniques such as sputtering and chemical vapor deposition (CVD).

Figure 4F:
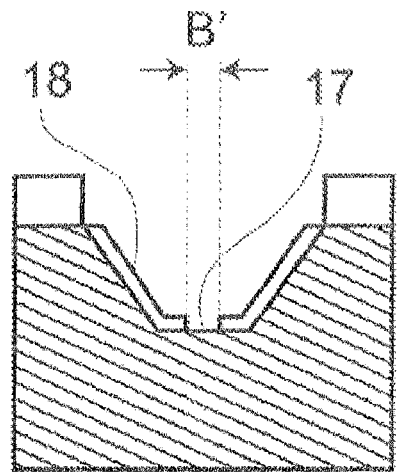

FIG. 4f illustrates the formation of an opening (17) in the second cover (16), which can be made at any position of the bottom (14) of the cavity. Thus, this step can be done in all the cavities formed in the substrate (11).

For the formation of the opening (17) there can be used the lithography process by focused ion beam, roughing the second cover (16) of $SiO_2$ and forming the second cover with an opening (18). The electron beam lithography technique (e-beam lithography) may also be used to create the second opening (17) in the second cover (16), and to do so add the following steps: (i) deposition of an organic layer, (optical) photoresists or PMMA (e-beam) by spin coating; (ii) the sensitization area to be roughed by optical or electron beam; (iii) developing, wherein the sensitized polymeric film is removed by a specific solvent (isopropyl alcohol, for example); (iv) removing the $Si_3N_4$ or $SiO_2$ layer in regions not protected by the polymer, which will generate the exposed Si areas by dipping the sample for 1 to 10 minutes, better 2 minutes, in a BHF solution of 5:1 (Buffered Hydrofluoric Acid solutions consisting of $NH_4F$ (40%) and HF (49%) in a ratio of 5:1).

Accordingly, there is formed the opening (17) on the second cover (16) which exposes only the silicon area dimension B' that can vary between 50-1,000 nm, preferably 450 nm. The dimension B' of the opening (17) of the second cover (16) equals the dimension B of the base of submicron tip (4) of the second portion (3) of the device. Since B' is a dimension used in manufacturing the cavity that works as a mold for the device, B' has a value close to B but may not be identical.

Figure 4G:
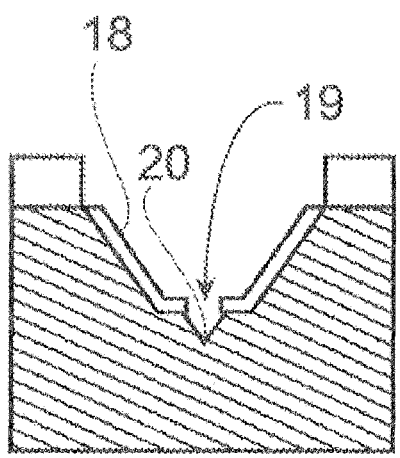

The dimension B' is close to the dimension L and can be changed aiming to scale the dimension L of the device to be produced. FIG. 4g illustrates the second step of anisotropic roughing of the substrate (11) in area B' formed by the second opening (17). This anisotropic chemical roughing process results in a second cavity (19), preferably with a second pyramidal bottom (20). The cavity (19) has a family of planes {111} of the substrate (11) silicon and its bottom (20), or vertex, with a size lower than 60 nm, preferably lower than 20 nm. To achieve the anisotropic roughing, there can be used a corrosive aqueous solution, preferably potassium hydroxide (KOH) or sodium hydroxide (NaOH) in concentrations of 15 to 40%, preferably 30% (by weight). The sample is dipped into the solution at 50 to 80° C., preferably at 65° C. for 30 seconds to 20 minutes, preferably 2 minutes. The anisotropic roughing time may be adjusted to obtain the smallest bottom (20). As the silicon anisotropic roughing in a KOH solution is anisotropic, the family of planes {100} of silicon is roughed approximately 300 times faster than the family of planes {111}. Thus, the family of planes {111} is developed and a pyramidal cavity (19) with the second bottom (20) is obtained.

In addition, other corrosive solutions may be used alternatively to those mentioned above, such as HF, CH3OOH, CsOH in $H_2O$, NH4OH in $H_2O$, TMAH in $H_2O$, ethylenediamine in $H_2O$ and pyrocatechol; hydrazine in $H_2O$ and isopropyl alcohol. The examples listed herein belong to the scope of the present invention without being exhaustive, as well as any other corrosive solution that can be used for anisotropic roughing of the substrate of interest.

After forming the cavity (19), there is the deposition of the metallic film that will give rise to the device itself. The deposition may be done by thermal deposition or sputtering techniques, the thermal deposition being preferred. The metallic film must be of gold (Au), silver (Ag), platinum (Pt), copper (Cu), aluminum (Al), and combinations or alloys of these elements.

Preliminarily to the deposition of the metallic film, the method of the present invention may further comprise an additional step of removal of the covers (12) and (16), preferably by a treatment with hydrofluoric acid. FIG. 4i shows the substrate (11) after the removal of the cover. Adding this step allows to obtain a device (1) without the extension (5), as shown in FIG. 3b.

FIG. 4h illustrates an embodiment of the present invention, wherein the process of depositing the metallic film (21) occurs on the covers, which will result in an embodiment of the device of the present invention.

Further, FIG. 4j illustrates another embodiment of the method of the present invention, wherein the metallic film will be deposited on the substrate (11) had removed the covers.

The thickness K of the metallic film may range from 50 nm to 1,000 nm, and preferably 200 nm. In one preferred embodiment of the present invention, there is performed the deposition of the film of gold (Au).

Figure 4K:
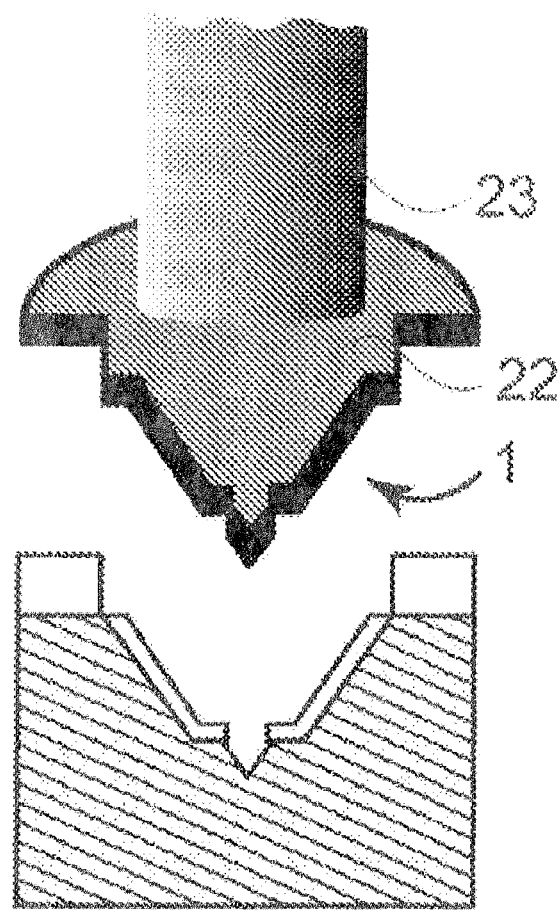

Next, there is performed the step of withdrawing the device (1) that may occur by fixing the same to a sensing system of the probe-surface interaction, preferably a tuning fork or cantilever by means of epoxy glue. Considering the pitch as a sensing system of the probe-surface interaction, a tungsten wire (W) of diameter lower than 50 μm must be previously fixed to one of the tuning fork ends by epoxy glue or cyanoacrylate. As illustrated in FIG. 4k, there is applied a small amount (approximately $2 \times 10^{-8}$ cm$^3$) of epoxy glue into the cavity containing the device (1) and positions the end of tungsten wire (already fixed in the tuning fork) within the cavity. After curing epoxy glue, the device is withdrawn (1) by moving together the tuning fork and the tungsten wire in a vertical direction with the aid of translation micropositioners and vertical translation support with micrometric precision of position better than 2 μm. As noble metals do not adhere to the silicon or to $SiO_2$, the device (1) will be withdrawn without being damaged.

The method of the present invention can be used for the manufacture of a metallic device for scanning probe microscopy such as optical spectroscopy and microscopy, optical microscopy and preferably near-field spectroscopy as a probe.

In an embodiment, the method of the present invention is capable of producing at least one metal device with a first cover (12) with at least one opening (13).

In still another embodiment, the method can produce a plurality of metal devices (1) by means of a first cover (12) with a plurality of openings (13).

In an embodiment, considering the application to an optical system that uses a HeNe laser, quite common in the art, and the device metal being gold, dimension B' of opening (17) is 450 nm. By using this value of the dimension B' of opening (17), the device will display a second portion (3) comprising a submicron tip with a nanometric apex (7) of surface dimension (L) of about 450 nm. This aspect favors the LSPR, and consequently the optical absorption resonance for radiation of wavelength λ=632.8 nm (HeNe laser), according to equation (1a).

It will be apparent to those skilled in the art that various modifications and variations can be made to this invention without departing from the spirit and scope thereof. Thus, it is intended that the present invention encompasses the modifications and variations provided they come within the scope of the appended claims and their equivalents.

The following non-limiting example reinforces the feasibility of both the proposed process and a matter taken into account in this invention.

Example—Manufacturing of Device, as Proposed in the Invention, by Ion Beam Lithography and Characterization by Scanning Electronic Microscopy The device addressed in this invention was manufactured by following the steps of the method proposed herein. More specifically, the manufacturing of cavities in the silicon substrate was performed by processes of focused beam ions (FIB). The starting material was a silicon <100> sample with a layer or cover of $SiO_2$ of 300 nm thick. For the first lithographic process, there were used a voltage of 30 kV and a current of 9 nA as parameters in the FIB in a dual beam microscope (Helios NanoLab 650—FEI Company). As a result of this step, the Si <100> substrate was exposed in the openings in the cover of $SiO_2$ in circular areas of 25 μm of diameter. The anisotropic roughing procedure was carried out using an aqueous solution of potassium hydroxide (KOH) in a concentration (mass) of 63% $H_2O$, 27% KOH and 10% isopropyl alcohol, heated at 65° C. in a thermal bath. The sample was dipped into the roughing solution for 40 minutes, followed by cleaning steps with deionized water in ultrasound for 10 minutes and drying with $N_2$ gas flow. At this point, using optical microscopy, it was possible to observe that the formed plateau as the flat and square bottom of cavities had a lateral dimension N' smaller than 2 μm.

The next step is based on growing a second cover, a $SiO_2$ layer on the surface of produced cavities, which will be used as the mask of the second lithographic process. For this, the sample was placed in an oven at ambient temperature and brought to 1000° C. for 300 minutes of residence time. The temperature ramp was 10° C./min both in the increase and decrease in the oven temperature. The local humidity was 65%.

For the second lithographic process, there were used a voltage of 30 kV and a current of 83 pA as FIB parameters in a dual beam microscope (Helios NanoLab 650—FEI Company). Thus, with the FIB, the $SiO_2$ layer covering the bottom of the cavity was removed in a circular area of diameter 300 nm, exposing the Si <100> in this region. The second anisotropic roughing procedure for establishing the smaller pyramidal cavity was conducted using an aqueous solution of potassium hydroxide (KOH) in concentration (mass) of 63% $H_2O$, 27% KOH and 10% isopropyl alcohol heated at 65° C. in a thermal bath. The sample was immersed in the roughing solution for 2 minutes, followed by cleaning steps with deionized water in ultrasound for 10 minutes and drying with $N_2$ gas flow.

The process sequence is illustrated in FIG. 4i, where covers or layers of $SiO_2$ were then removed by using hydrofluoric acid solution consisting of aqueous solutions of fluoride ammonium ($NH_4F$ 40%) and hydrofluoric acid (HF 49%) in ratio 5:1. In sequence, the sample cleanup step was performed using deionized water in ultrasound for 10 minutes and drying with $N_2$ gas flow. Then, a film 200 nm thick of Au (99.995%) was deposited on the silicon and sample cavities by thermal evaporation at a rate of 0.2 nm/sec.

Finally, the withdrawing step of the metal device from within the segmented pyramidal cavity was performed. This step occurs by fixing the same to a sensing system of the probe-surface interaction, preferably a tuning fork by means of epoxy glue. Considering a tuning fork as the sensing system of the probe-surface interaction, a tungsten wire (W) of diameter D of 15 μm was previously attached to one end of the tuning fork, by cyanoacrylate glue. Applying a small amount of epoxy resin in the cavity that contains the device and positioning the end of tungsten wire (already fixed in pitch) within the cavity with the help of translation micro-positioners X, Y and Z with a resolution of 2 μm, it was possible to withdraw the device already prepared as a probe for SNOM and related techniques.

Figure 5A:
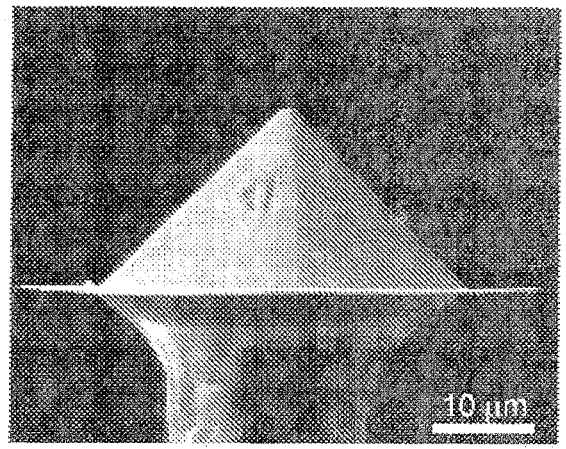
FIGS. 5a and 5b are images taken by scanning electron microscopy at two different magnifications of a probe manufactured according to the invention and described in the Example.
Figure 5B:
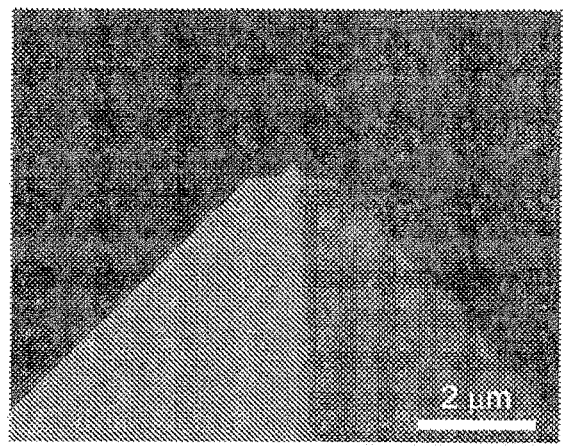

One of the produced probes can be visualized in the scanning electron microscopy images shown in FIGS. 5a and 5b. In FIG. 5a, in lower magnification, there can be seen the device attached to the end of a wire W. In FIG. 5b, at higher magnification, it is possible to observe the submicron pyramid with size L of approximately 330 nm and an apex of diameter smaller than 40 nm, positioned on the plateau side (N) of about 1.10 μm. This is a possible embodiment of the device treated herein, and the dimensions and characteristics of the observed object correspond to those discussed herein. This therefore indicates the feasibility of the method and device proposed in this invention.

Figure 6:
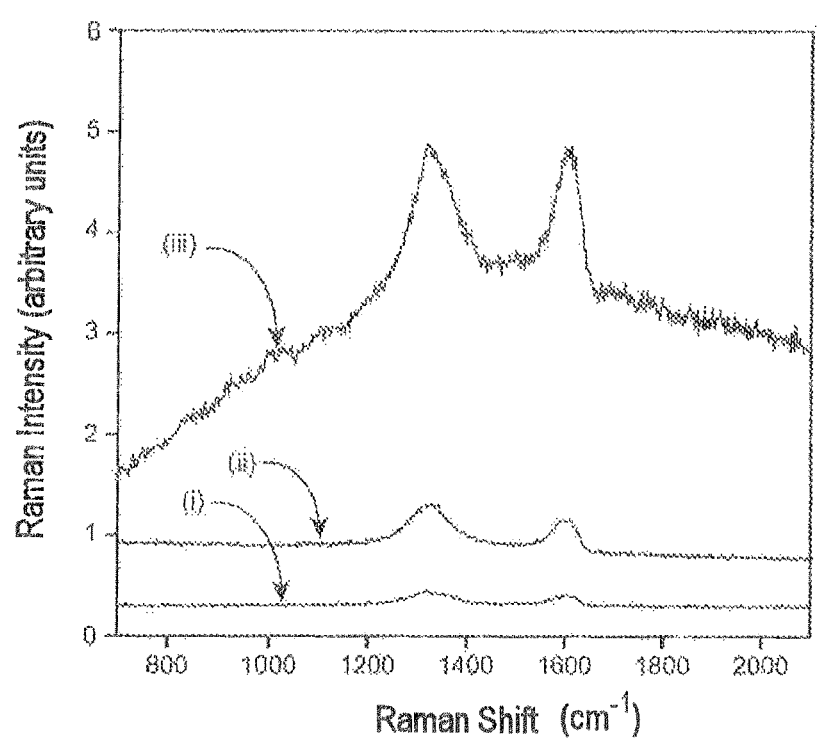
FIG. 6 is a graph with three Raman spectra acquired of a monolayer of graphene oxide: (i) without a probe; (ii) with a prior art probe, i.e., a gold pyramid; and (iii) with the prototype of this invention discussed in the Example.

The optical response upon applying the prototype, as described in this example, to a sample of graphene oxide monolayer can be observed in FIG. 6. In the graph, we compare the acquired Raman spectra: (i) no tip, (ii) with a probe of the state of the art, i.e., a gold pyramid, and (iii) with the prototype of the invention taken into account in this example. It is possible to observe that the increase of the Raman signal obtained in this example with the invention is approximately 3 times higher than that produced with the probe of the state of the art. This experiment highlights the potential and optical efficiency of the device provided in this invention.

The invention claimed is:

1. A device for scanning near-field optical microscopy (SNOM, NSOM, NFOM), tip-enhanced Raman spectroscopy (TERS), scanning probe microscopy, wherein the device is manufactured by a metallic deposition on a structured cavity in a silicon substrate, said device comprising an unitary metallic body arranged in a first pyramidal portion having a rectangular base, and a second portion, wherein the second portion comprises a pyramidal submicron tip having a rectangular base smaller or equivalent to the order of magnitude of the wavelength of the laser or of the incident light, with a nanometric apex, wherein the first base and the second base are parallel to each other and spaced apart by a distance (G) ranging from 0.5 μm to 250 μm, wherein said first base has an area greater than the second base.

2. The device according to claim 1, wherein the side dimension (H) of the first base is from 3 µm to 300 µm, and the side dimension (N) of the second base is from 0.5 µm to 10 µm.

3. The device according to claim 1, wherein the second portion is located on the second base of the first portion.

4. The device according to claim 1, wherein the second portion comprises a pyramidal submicron tip of a rectangular base with a nanometric apex, wherein the side dimension (B) of the base of said submicron tip is from 50 nm to 1000 nm.

5. The device according to claim 1, wherein the device further comprises an extension connecting the submicron tip and the second base, said extension having a thickness (P) of from 10 nm to 500 nm.

6. The device according to claim 1, wherein the pyramidal submicron tip of the base has a length (L) ranging from 50 nm to 900 nm.

7. The device according to claim 1, wherein the device is hollow, and is covered at least in part by a metallic film formed entirely or predominantly of a metal selected from the group consisting of gold, silver, platinum, copper, aluminum, and a combination and an alloy thereof, having a thickness (K) of 50 nm at 1000 nm, and wherein an opening angle of faces of the first portion and the second portion is from 30 to 100°.

8. A method of manufacturing the device of claim 1, comprising the following steps in sequence of:
(i) providing a substrate and forming a first cover with at least one opening on a surface of the substrate;
(ii) anisotropic roughing of areas of the surface of the substrate through the at least one opening to a depth (G) for form a cavity with a bottom;
(iii) forming a second cover on the bottom and side walls of the cavity;
(iv) forming a second opening in the second cover;
(v) anisotropic roughing of areas of the substrate exposed through the second opening;
(vi) deposition of a metallic film on the substrate from step (v), whereby to form a shaped metal film; and
(vii) separating the shaped metal film from the substrate.

9. The method according to claim 8, wherein in step (i), the opening is circular, elliptical or polygonal in shape with at least 3 sides, having a dimension (H') of 3 µm to 300 µm, and wherein multiple openings are formed in the same cover, with a distance (M) between the openings of from 10 µm to 1000 µm.

10. The method according to claim 8, wherein in step (ii), the anisotropic roughing is carried out by immersing the substrate with the cover in a corrosive solution, of potassium (KOH) or sodium hydroxide (NaOH) in the concentration of 15 to 40% at a temperature of 50° C. to 80° C., for 10 to 200 minutes, to form the bottom having an dimension (N') of 0.5 µm to 10 µm.

11. The method according to claim 8, wherein in step (iii), the formation of the second cover on the bottom and side walls is of $SiO_2$ from the silicon of the cavity created on the substrate, the second cover being created by heat treatment at temperature of 800 to 110° C., for 30 to 600 minutes, said second cover comprising a thickness (P) ranging from 10 nm to 500 nm.

12. The method according to claim 8, wherein in step (iv), the second opening of the second cover has a dimension (B') ranging from 50 to 1000 nm, and is made by a lithographic process, by focused beam of ions, by roughing the second cover, of the bottom of the cavity.

13. The method according to claim 8, wherein in step (v), the anisotropic roughing of the substrate in an area (B) formed by the second opening is performed by immersing the substrate assembly of the first cover and the second cover with the opening in a corrosive aqueous solution of potassium hydroxide (KOH) or sodium hydroxide (NaOH) in a concentration of 15 to 40% by mass, at a temperature from 50° C. to 80° C., for 30 seconds to 20 minutes.

14. The method according to claim 8, wherein in steps (ii) and (v), the corrosive aqueous solution used in the anisotropic roughing of the substrate is selected from the group consisting of HF, CH3OOH, CsOH in $H_2O$, $NH_4OH$ in $H_2O$, TMAH in $H_2O$, ethylenediamine in $H_2O$ and pyrocatechol, hydrazine in $H_2O$ and isopropyl alcohol, potassium hydroxide (KOH) in $H_2O$ and sodium hydroxide (NaOH)) in $H_2O$.

15. The method according to claim 8, and further comprising a step of removing the covers, preferably being carried out with hydrofluoric acid solution.

16. The method according to claim 8, wherein in step (vi), the deposition of the metallic film is carried out by thermal deposition or sputtering, wherein the metal of the metallic film is selected from the group consisting of gold (Au), silver (Ag), platinum (Pt), copper (Cu), aluminum (Al), a combinations and an alloys thereof, with a thickness (K) of the metallic film ranging from 50 nm to 1000 nm.

17. The method according to claim 8, wherein in step (vii), the separating of the shaped metal device occurs by fixing one end of a tungsten wire (W) to a sensing system of to the shaped metal device, and fixing another send of the tungsten wire a tuning fork or cantilever.

* * * * *